(12) United States Patent
Sun et al.

(10) Patent No.: US 9,485,082 B1
(45) Date of Patent: Nov. 1, 2016

(54) MULTI-MODE PHASE-FREQUENCY DETECTOR FOR CLOCK AND DATA RECOVERY

(71) Applicant: QUALCOMM Incorporated, San Diego, CA (US)

(72) Inventors: Li Sun, San Diego, CA (US); Zhi Zhu, San Diego, CA (US); Miao Li, San Marcos, CA (US); Xiaohua Kong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/747,789

(22) Filed: Jun. 23, 2015

(51) Int. Cl.
*H04L 7/00* (2006.01)
*H04L 7/033* (2006.01)

(52) U.S. Cl.
CPC ........... *H04L 7/0025* (2013.01); *H04L 7/0008* (2013.01); *H04L 7/033* (2013.01)

(58) Field of Classification Search
CPC .... H04L 7/0025; H04L 7/0008; H04L 7/033
USPC ................................ 375/354, 355, 373–376
See application file for complete search history.

(56) References Cited

U.S. PATENT DOCUMENTS

| | | | |
|---|---|---|---|
| 8,634,509 B2 | 1/2014 | Crain et al. | |
| 2005/0147194 A1 | 7/2005 | Koenenkamp | |
| 2007/0047683 A1 | 3/2007 | Okamura et al. | |
| 2007/0177700 A1 | 8/2007 | Saeki | |
| 2008/0063124 A1 | 3/2008 | Song et al. | |
| 2012/0177159 A1 | 7/2012 | Kong et al. | |
| 2013/0108001 A1 | 5/2013 | Chang et al. | |
| 2014/0086291 A1 | 3/2014 | Asmanis et al. | |
| 2014/0139266 A1 | 5/2014 | Kenney et al. | |
| 2014/0192935 A1 | 7/2014 | Palusa et al. | |

OTHER PUBLICATIONS

Lee S.W., et al., "Clock and Data Recovery Circuit Using Digital Phase Aligner and Phase Interpolator," 49th IEEE International Midwest Symposium on Circuits and Systems (MWSCAS), 2006, pp. 690-693.
Dalton D., et al., "A 12.5-mb/s to 2.7-Gb/s Continuous-Rate CDR with Automatic Frequency Acquisition and Data-Rate Readback," IEEE Journal of Solid-State Circuits, Dec. 2005, vol. 40, No. 12, pp. 2713-2725.
International Search Report and Written Opinion—PCT/US2016/033830—ISA/EPO—Jul. 29, 2016.

*Primary Examiner* — Freshteh N Aghdam
(74) *Attorney, Agent, or Firm* — Haynes and Boone, LLP (57) ABSTRACT

A clock and data recovery (CDR) circuit produces an in-phase clock, a quadrature clock offset by 90 degrees from the in-phase clock, and an auxiliary clock offset from the in-phase clock by a fraction of 90 degrees. A data sampler cyclically samples a data signal to form sets of samples according to the in-phase, quadrature, and auxiliary clocks, each set comprising an in-phase sample, a quadrature sample, and an auxiliary sample. A CDR logic circuit processes the samples to form a timing word for each set.

21 Claims, 5 Drawing Sheets

MULTI-MODE PHASE-FREQUENCY DETECTOR FOR CLOCK AND DATA RECOVERY

TECHNICAL FIELD

This application relates to improving clock and data recovery (CDR) circuits, and more particularly to phase-frequency detection of such circuits.

BACKGROUND

It is conventional for high-speed data communications systems to transmit data without any additional timing references. Receivers in such embedded clock systems include a clock and data recovery (CDR) circuit that retrieves the clock responsive to the binary transitions in the received data. For this reason, embedded clock systems typically encode the data to prevent long series of consecutive binary ones or zeroes so as to ensure there are sufficient binary transitions to enable the CDR circuit to retrieve the clock.

To perform the clock retrieval, CDR circuits typically use some form of a phase detector circuit. Although phase detectors allow the CDR circuit to detect the binary transitions, such detections without frequency detection can be problematic. In particular, the CDR circuit may lock onto an incorrect frequency instead of the desired clock frequency, such as due to the presence of jitter. To prevent such conditions, CDR circuits with frequency detectors have been developed. The frequency detector enables a CDR circuit to distinguish the offset between the clock rate and the data rate so that the clock is not synchronized incorrectly.

However, conventional CDR circuits with frequency detection are complex and power hungry, thereby increasing the costs of manufacturing and limiting battery life in mobile systems that incorporate such conventional CDR circuits. Accordingly, there is a need in the art for CDR circuit designs with frequency detection with reduced complexity and power consumption.

SUMMARY

A clock and data recovery (CDR) circuit is provided that interpolates between phases of a multi-phase clock to produce an in-phase clock, a quadrature clock offset in phase by 90 degrees (a quadrature phase offset) from the in-phase clock, and an auxiliary clock offset in phase from the in-phase clock by some fraction of 90 degrees. A data sampler cyclically samples a data signal according to the produced clocks to produce sets of samples, each set including an in-phase data sample sampled responsive to the in-phase clock, a quadrature data sample sampled responsive to the quadrature clock, and an auxiliary data sample sampled responsive to the auxiliary clock. A CDR logic circuit processes each set of samples to produce a corresponding timing word. In response to comparing a timing word for a current set of samples to a timing word for a preceding set of samples, the CDR logic circuit controls the interpolation between the phases of the multi-phase clock so that the in-phase clock is synchronized to a data rate for the data signal.

These and additional advantageous features may be better appreciated with regard to the following detailed description of example embodiments.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A clock and data recovery (CDR) circuit is provided that accurately synchronizes to the data using an auxiliary clock in addition to the conventional in-phase and quadrature clocks. The auxiliary clock is offset in phase from the in-phase clock by a fraction of 90 degrees such that it will have a clock edge that occurs between corresponding clock edges of the in-phase and quadrature clocks. By processing data samples taken according to the in-phase clock, the quadrature clock, and the auxiliary clock, the CDR circuit inherently determines the frequency relationship of the in-phase clock to the data rate. Unlike the complex and power-hungry conventional CDR architectures that employ frequency detection, the disclosed CDR circuit merely requires some additional logic processing as compared to a conventional bang-bang phase detector that uses data sampled according to the in-phase and quadrature clocks.

For example, the CDR circuit may include two gates in one embodiment to form a two-bit timing word. With regard to these logic gates, there are three data samples to be processed in any given data period for the data signal: an in-phase data sample as sampled according to the in-phase clock, an auxiliary data sample as sampled according to the auxiliary clock, and a quadrature data sample as sampled according to the quadrature clock. One of the data samples is processed by both logic gates whereas each logic gate processes a unique remaining one of the data samples. For example, the auxiliary data sample may be common to both logic gates. In such an embodiment, one logic gate may process the in-phase data sample and the auxiliary data sample to produce a first bit for the timing word. A remaining logic gate would then process the auxiliary data sample and the quadrature data sample to produce a second bit for the timing word. It will be appreciated that the in-phase data sample or the quadrature data sample may be selected as the common data sample in alternative embodiments.

In one embodiment, the quadrature clock is advanced in phase by 90 degrees with respect to the in-phase clock (it may be delayed by 90 degrees in alternative embodiments). The auxiliary clock is phased so as to have a clock edge that occurs in between the corresponding edges of the quadrature clock and the in-phase clock. If the in-phase clock has a rising edge at the middle of a bit period and if the quadrature clock has a rising edge at the beginning of the bit period, the auxiliary clock would then have a rising edge sometime during the first half of the data period so as to be between the in-phase and quadrature clock edges. For example, if the auxiliary clock is advanced by 45 degrees with respect to the in-phase clock, it would have a rising edge at ¼ of the data period when the in-phase clock edge is synchronized so as to be in the middle of the data eye (at ½ of the bit period).

The following example embodiments will assume that both the rising edge and the falling edge of the in-phase clock, the quadrature clock, and the auxiliary clock are used to sample the data. But it will be appreciated that in alternative embodiments, only the rising or falling edges may be used. Since both clock edges are used to sample the data, the clock frequencies are ideally one-half the data rate. Given this relationship between the clock rates and the data rates, the quadrature clock is advanced in phase by one-half of the data bit interval (0.5*UI) with regard to the in-phase clock. In an embodiment in which both clock edges are used to sample the data, the quadrature clock is thus advanced 90° in phase in comparison to the in-phase clock. The auxiliary clock is advanced in phase in comparison to the in-phase clock by some portion a of the data interval ($\alpha$*UI), where a is less than 0.5 and greater than zero. For example, a may equal 0.25 in one embodiment such that the auxiliary clock is advanced by 45° with regard to the in-phase clock.

Figure 1:
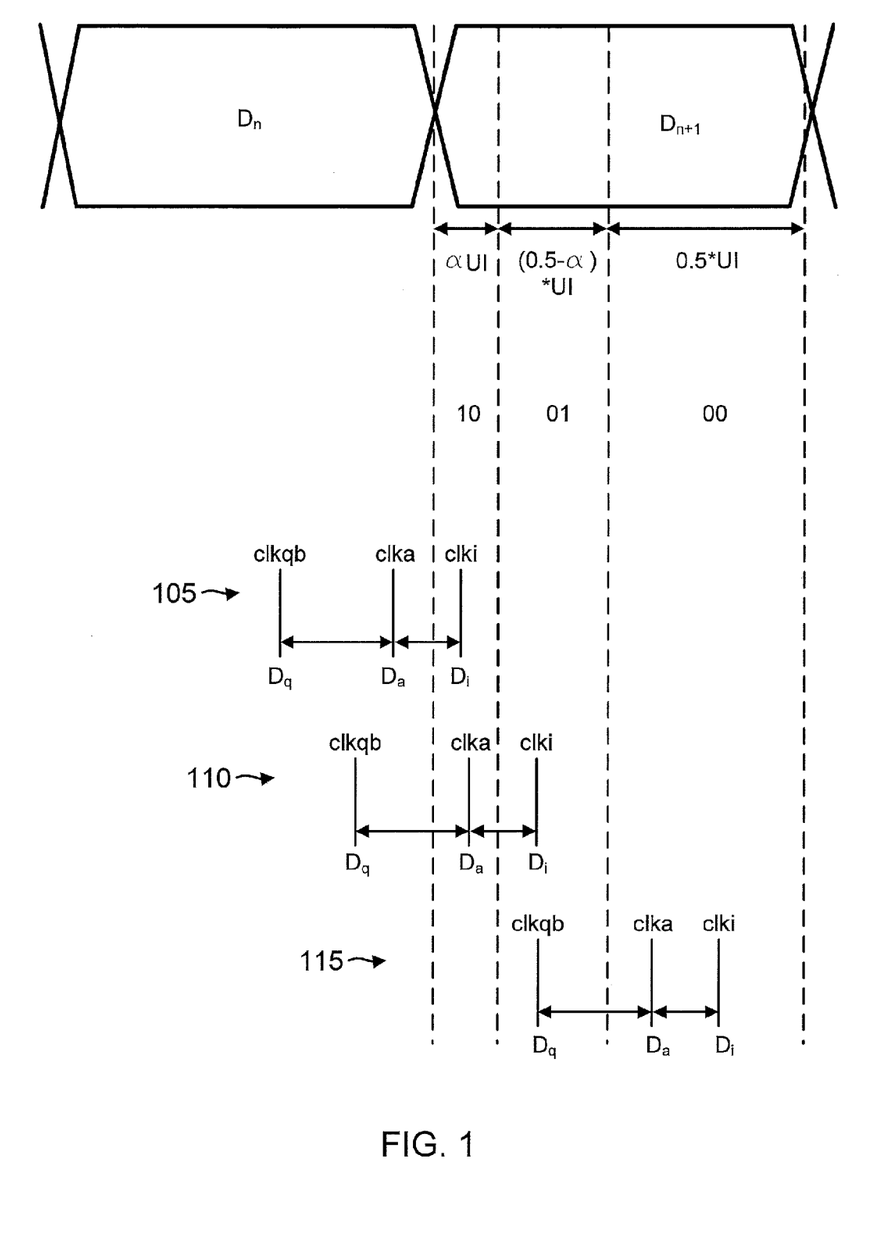
FIG. 1 is a timing diagram for various in-phase clock alignments with the data for a clock and data recovery (CDR) circuit in accordance with an embodiment of the disclosure.

Because of the phase relationship between the in-phase, quadrature, and auxiliary clocks, each bit period for the data signal may be divided into three regions depending upon where the in-phase clock edge is located. The timing word has a unique value that identifies in which region the in-phase clock edge sampled a given data bit. The division of the bit period for an embodiment in which the quadrature and auxiliary clocks are advanced in phase with regard to the in-phase clock is shown in FIG. 1 for a data bit Dn+1. This bit period or duration for data bit Dn+1 is designated as UI. The bit period duration UI is divided into three regions: a first region designated as 10 that extends from the beginning of UI to $\alpha$UI, a second region designated as 01 that extends from $\alpha$UI to 0.5 UI (the middle of the data eye), and a third region designated as 00 that extends from the middle of the data eye to the end of UI. The variable $\alpha$ represents the phase offset between the auxiliary clock and the in-phase clock. Region 10 has a width or duration of $\alpha$UI whereas region 01 has a duration of (0.5−$\alpha$)UI. Finally, region 00 has a duration of 0.5 UI.

Depending upon the clock timing with respect to the data, an in-phase clock edge clki will sample one of the three regions. An auxiliary clock edge clka is displaced in phase by $\alpha$UI from the in-phase clock edge clki. Similarly, a quadrature clock edge clkq is displaced in phase by 0.5 UI from the in-phase clock edge ckli. Each clock edge produces a corresponding data sample. An in-phase data sample Di is taken according to the in-phase clock edge clki. Similarly, an auxiliary data sample Da is taken according to the auxiliary clock edge clka. Finally, a quadrature data sample Dq is taken according to the quadrature clock edge clkq. One data sample may then be compared to the remaining two to determine in which region the in-phase data sample Di was taken. For example, in one embodiment, a two-bit timing word may be formed in which the first bit equals Di⊕Da, where ⊕ represents the XOR function. A second bit may be formed as Da⊕Dq. The two corresponding logic gates discussed above would thus comprise two XOR gates. The resulting timing word in such an embodiment would then equal [Di⊕Da, Da⊕Dq]. The following discussion will show that the regions 10, 01, and 00 are so named because that is the result of the timing word formed according to the formula [Di⊕Da, Da⊕Dq] when the Di sample is taken in the corresponding region. In other words, if the Di sample is taken in region 00, the timing word is also 00. Similarly, if the Di sample is taken in region 01, the timing word is also 01, and so on. It may thus be seen that the timing word will equal one of three possible values: 10, 01, or 00 depending upon which region of the current data cycle is sampled by the in-phase clock edge.

The data is cyclically sampled responsive to the edges of the quadrature, auxiliary, and in-phase clocks to form corresponding sets of samples, each set comprising the corresponding Da, Dq, and Di samples. To provide a better appreciation of the possible timing relationship between a given sample set and a current data bit, FIG. 1 illustrates three different sample sets 105, 110, and 115. Each sample set represents a potential phasing of the various clocks to the data. For sample set 105, the corresponding edges of the quadrature clock, the auxiliary clock, and the in-phase clocks are designated as clkqb, clka, and clki, respectively. Analogous versions of the clock edges are shown for the remaining sample sets 110 and 115. In comparison to sample sets 110 and 115, the in-phase clock, the auxiliary clock, and the quadrature clock are relatively advanced in phase with regard to a current data bit Dn+1. The in-phase clock edge clki thus occurs in region 10 for current data bit Dn+1 in sample set 105. In contrast, a more delayed timing relationship between the clock edges and the current data bit Dn+1 is shown for sample set 110 in that the in-phase clock edge clki occurs in region 01 of current data bit Dn+1. Finally, an even more delayed timing relationship is shown for sample set 115 in that the in-phase clock edge clki samples in region 00 of current data bit Dn+1.

Given these various possible timing relationships between the clock edges and the current data bit, each sample set 105, 110, and 115 results in a different timing word. For each sample set, the quadrature clock sample of the data is designated as Dq whereas the auxiliary clock sample of the data is designated as Da. Similarly, the in-phase clock sample of the data for each sample set is designated as Di. In sample set 105, the corresponding edges for both the auxiliary clock and the quadrature clock sample a preceding data bit Dn. But the Di data sample for sample set 105 comes from the current data bit Dn+1. In general, one does not know whether the binary value of Dn and Dn+1 will be equal or not for two consecutive data bits. Since the data is encoded for clock retrieval, one can assume, however, that the binary values for two such consecutive bits will be on average complementary to each other such that an XOR of the in-phase sample Di of current bit Dn+1 with the auxiliary clock sample Da of previous bit Dn will be on average a binary one when the in-phase data sample Di is taken in the 10 region such as shown for sample set 105. Conversely, both the auxiliary clock edge and the quadrature clock edge sample the same previous data bit Dn when the in-phase clock edge is in the 10 region. An XOR of the Da and Dq samples from previous data bit Dn will always be zero absent some substantial noise disturbance. Thus, the timing word equals [10] on average when the in-phase clock edge clki samples in region 10 for a given data bit such as shown for sample set 105.

Should the timing relationship between the clocks and the data be such that in-phase clock edge clki move into the 01 region as shown for sample set 110, both the in-phase data sample Di and the auxiliary data sample Da are taken from current data bit Dn+1. The XOR of these two samples will thus be zero. In contrast, the quadrature data sample Dq is still being taken from previous data bit Dn such that the XOR of data samples Da and Dq will typically equal a binary one. The timing word may thus be expected to equal [01] on average when the in-phase clock clki falls within region 01 such as shown for sample set 110.

Finally, should the timing relationship between the clocks and the data be such that the in-phase clock edge samples within the 00 region as shown for sample set 115, the data samples Di, Da, and Dq will all be from the current data bit Dn+1. This means that both corresponding XORs will be a binary zero. Thus, the timing word equals [00] when the in-phase clock edge clki samples a data bit in its region 00 such as shown for sample set 115.

Although sample sets 105, 110, and 115 each represent a specific timing relationship between the clocks and the data, it may readily be appreciated that the same timing words are produced so long as the in-phase clock edge samples within a given region. In other words, if the in-phase clock edge samples somewhere within region 10, the corresponding timing word will on average equal 10. Similarly, if the in-phase clock edge samples somewhere in the 01 region, the corresponding timing word will on average equal 01. Finally, if the in-phase clock edge samples somewhere within region 00, the corresponding timing word will equal 000. Given these three regions as identified by the corresponding timing words, frequency detection for the corresponding CDR circuit becomes inherent. For example, suppose that the logic circuit within the CDR circuit detects a series of timing words [10], [01], and [00] for three consecutive sample set processing periods. Such a transition indicates that the in-phase clock frequency needs to be increased in that each successive set's in-phase clock edge clki is lagging (falling within a subsequent region) as compared to the preceding set's in-phase clock edge clki. Conversely, a timing word series of [00], [01], and [10] indicates that the in-phase clock is too fast compared to the data rate. The CDR circuit may thus determine whether the clock rate for the in-phase clock is too slow or too fast based upon the timing word transitions. The CDR circuit may then adjust the clock rate up or down in frequency accordingly. In this fashion, the CDR circuit accurately synchronizes the clock to the data (as used herein, "clock" without further qualifiers is referring to the in-phase clock).

It should be noted that multiple other scenarios and implementations may be used to align the in-phase clock with the middle of the data eye for the current data bit Dn+1. For example, rather than compare the auxiliary data sample to the remaining in-phase and quadrature samples, the in-phase sample may instead be compared to the auxiliary data sample and to the quadrature sample to form an alternative timing word. Further, various other logic gates may be used to compare the samples in alternative embodiments such as, for example, AND, NAND, OR, and/or NOR gates.

Figure 2:
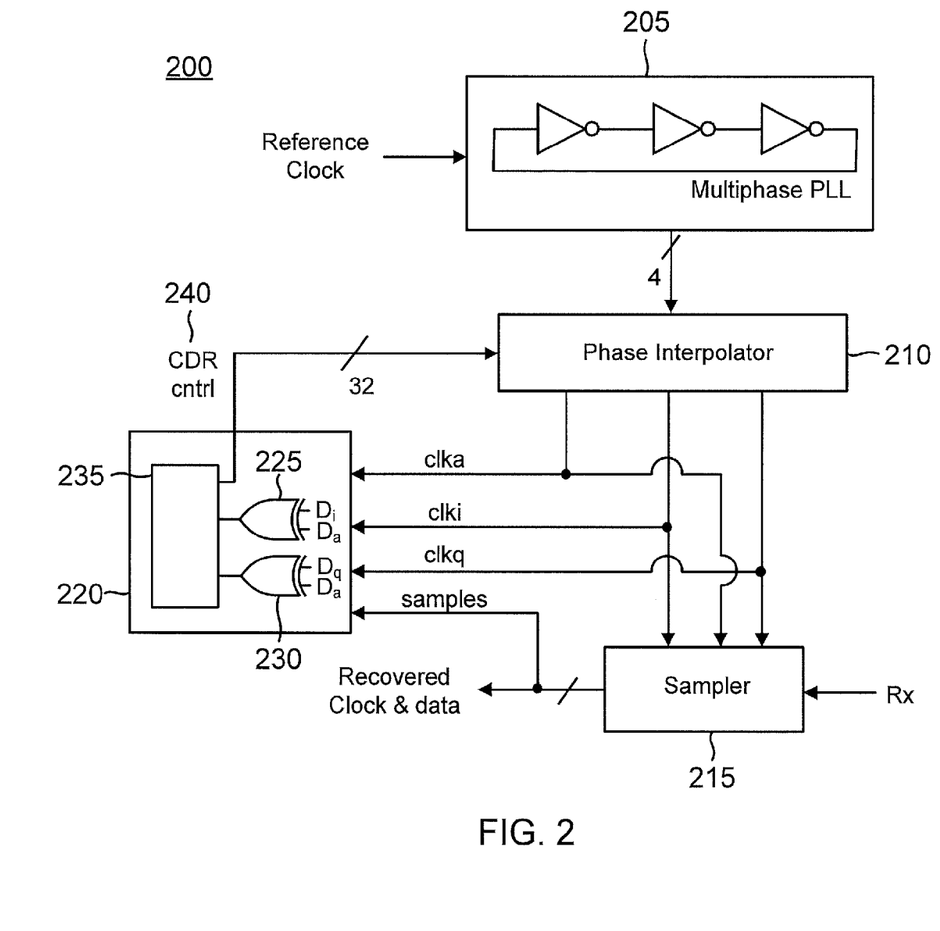
FIG. 2 is a block diagram of an example CDR circuit in accordance with an embodiment of the disclosure.

An example CDR circuit that uses the timing words discussed with regard to FIG. 1 is shown in FIG. 2. A reference clock drives a multi-phase phase-locked loop (PLL) 205 that produces a plurality of phased clocks such as a 0 degree clock and a 180 degree clock that is the complement of the 0 degree clock. In addition, PLL 205 produces a 90 degree clock that is advanced in phase by 90 degrees with respect to the 0 degree clock and a 270 degree clock that is the complement of the 90 degree clock. These four clocks are received by a phase interpolator 210. Phase interpolator 210 interpolates the clocks received from PLL 205 to produce the in-phase clock clki. Similarly, phase interpolator 210 interpolates the clocks received from PLL 205 to produce the quadrature clock clkq. Finally, phase interpolator 210 interpolates the clocks received from PLL 205 to produce the auxiliary clock clka. Depending upon its interpolation of the received clocks from PLL 205, the in-phase clock may be faster or slower in frequency compared to the 0 degree clock. The corresponding interpolation for the auxiliary and quadrature clocks is such that they retain their desired αUI and 0.5 UI phase relationship to the in-phase clock. It will be appreciated that a phase interpolator is a well-known component of a conventional CDR circuit. But in such conventional interpolators, the PLL clocks are interpolated to produce an in-phase clock and a quadrature clock that is then processed by a bang-bang phase detector. The resulting conventional CDR circuit is prone to timing errors as discussed earlier. Phase interpolator 210 is thus enhanced to also produce the auxiliary clock. But such interpolation in phase interpolator 210 may be performed according to well-known principles in phase interpolator design.

A sampler 215 samples a received data signal Rx (with its embedded clock) according to the edges of clocks clki, clkq, and clka. In alternative embodiments, the received data signal may instead be differential rather than single-ended. The resulting samples are processed by a CDR logic circuit 220 that includes a first XOR gate 225 (a first logic gate) that XORs the in-phase data sample Di with the auxiliary data sample Da to produce the first bit of the current timing word. A second XOR gate 230 (a second logic gate) XORs the auxiliary data sample Da with the quadrature data sample Dq to form the second bit of the current timing word. A phase interpolator control circuit 235 compares the current timing word to one or more previous timing words to control phase interpolator 210 accordingly through a CDR control signal 240. In one embodiment, CDR control signal 240 may comprise a thermometer code such as a 32-bit-wide thermometer code to guard against control glitches. Phase interpolator 210 interpolates from the clocks received from PLL 205 responsive to CDR control signal 240 to produce the in-phase clock clki, the auxiliary clock clka, and the quadrature clock clkq.

Since the 00 timing word uses two samples from the same bit, it is assured to equal 00 absent some appreciable noise in the samples. However, the 10 and 01 timing words will only equal those values on average as their values depend on the embedded clock tending to make consecutive bits complementary. There will be consecutive bits having the same binary value. Thus phase interpolator control circuit 235 may be configured to average samples from consecutive bits to determine the corresponding timing word. In alternative embodiments, phase interpolator control circuit 235 may be configured to determine the corresponding timing word using just one set of Di, Da, and Dq data samples. For example, the control algorithms discussed below would not make any phase adjustments should there be no binary transition for a current data bit in that the resulting timing word of 00 results in no changes according to these control algorithms. So no averaging would be needed or required in such embodiments. Regardless of the particular control algorithm being implemented, phase interpolator control circuit 235 may comprise a state machine or a logic circuit implemented using digital logic gates.

Phase interpolator control circuit 235 compares the timing words responsive to a clocking such as from clki, clka, or clkq clocks. Although all three clock signals are shown being received by CDR logic circuit 220, just one clock such as the in-phase clock clki is sufficient to trigger the generation of the current CDR control signal 240 by phase interpolator control circuit 235. The comparison of the current timing word to a preceding timing word to then control the interpolation by phase interpolator 210 such that the in-phase clock clki is maintained in the center of the data eye may be performed in a number of ways by phase interpolator control circuit 235. Some example algorithms will now be discussed but it will be appreciated that alternative control algorithms may be used.

In one embodiment, CDR logic circuit 220 may be deemed to comprise a means for controlling the interpolation by phase interpolator 2410 responsive to comparisons of a timing word for a current one of the sets to a timing word to a preceding one of the sets such that the in-phase clock is synchronized with a data rate for the data signal.

Figure 3:
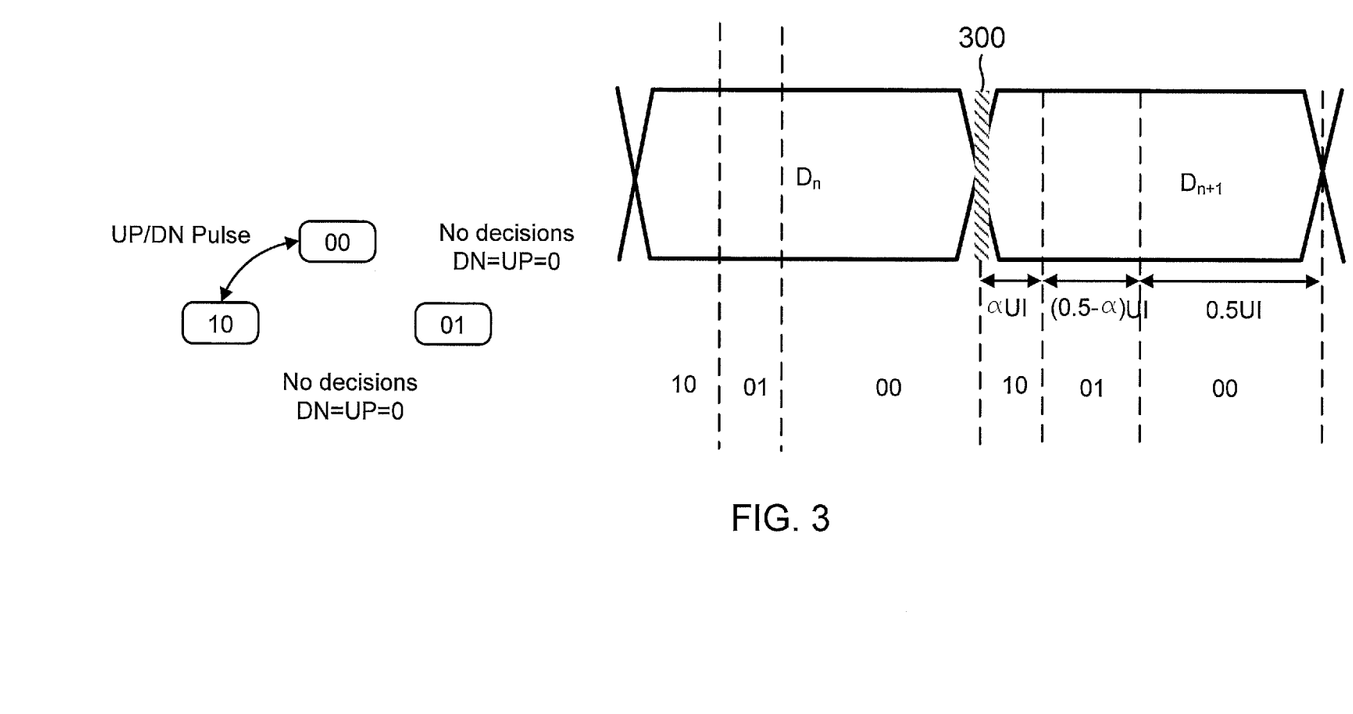
FIG. 3 is a timing diagram for a linear control algorithm for the CDR circuit of FIG. 2.

A timing diagram for a first control algorithm is shown in FIG. 3. With regard to changing the phase interpolation in phase interpolator 210 through CDR control signal 240, note that one of three things can happen: 1) the phase interpolation may be kept unchanged with regard to producing the in-phase clki and its associated auxiliary and quadrature clocks; 2) CDR control signal 240 may be changed so that the in-phase clock (and its associated clocks) increase in phase compared to their previous interpolations; and 3) CDR control signal 240 may be changed so that the in-phase clock (and its associated clocks) decrease in phase compared to their previous interpolations. These three possibilities are selected from at some regular rate as determined by the timing of CDR logic circuit 220. In other words, a first timing word is generated. Then a second timing word is generated, followed by a third timing word, and so on. The timing word generation may thus be data-bit-by-data-bit or it may occur at some slower (decimated) rate. Whatever the timing is, CDR control signal 240 may be updated according to this regular re-calculation of the current timing word. The period for this timing is denoted herein as a CDR cycle. Based on that timing, CDR control signal 240 may be deemed to be pulsed accordingly. For example, if the current timing word indicates that the in-phase clock should be increased in phase, CDR control signal 240 is pulsed "up" accordingly for the corresponding CDR cycle. This up pulse triggers an advance in phase for the in-phase clock (and the associated auxiliary and quadrature clocks). Alternatively, if the current timing word as compared to the previous cycle's timing word indicates that the phase of the in-phase clock should be decreased, CDR control signal 240 may be pulsed "down" accordingly for the corresponding CDR cycle. Finally, if the current timing word comparison indicates that no phase change should be made, CDR control signal 240 is maintained constant with whatever value had been used in the last CDR cycle. Since this lack of a change occurs across a CDR cycle, it may be deemed to comprise a "no change" pulse of CDR control signal 240.

Given these definitions of a no change pulse, an up pulse, or a down pulse in CDR control signal 240, a boundary 300 between the current bit Dn+1 and the previous bit Dn may be used as shown in FIG. 3. Should this boundary be crossed in a given CDR cycle, either an up or down (dn) pulse is generated. For example, suppose the previous timing word had been 10 but the current timing word is 00. As shown in FIG. 3, the timing word 00 would actually be sampling the 00 region in the previous bit Dn as opposed to the desired sampling of the current bit Dn+1. The in-phase clock rate is thus too fast such that CDR control signal 240 is pulsed down for the current CDR cycle. Alternatively, suppose that the previous timing word had been 00 but the current timing word is 10. Such a timing transition indicates that the in-phase clock rate is too slow such that CDR control signal 240 should be pulsed up in the current CDR cycle. Finally, if the transition is 00 to 01, 01 to 00, 01 to 10, or 10 to 01, CDR control signal 240 is left unchanged in the first control algorithm.

With regard to an up or down pulse of CDR control signal 240, note that some gain setting must be selected. In other words, depending upon the gain setting, an up pulse may change the in-phase clock phase by some variable amount. It will be appreciated that this gain setting is a design choice in the implementation of phase interpolator control circuit 235. Regardless of the gain setting, the phase of the in-phase clock (as well as its associated auxiliary and quadrature clocks) will be pulsed up or down only when boundary 300 is crossed according to the first control algorithm. Note that this boundary crossing is directly proportional to the frequency offset between the in-phase clock rate and the data rate. If this offset is greater, boundary 300 will be crossed a greater number of times during some unit of time as compared to the number of boundary crossings for a smaller offset. One can thus appreciated that the first control algorithm is "linear" in the sense that the up and down pulsing will occur at a rate that is directly proportional to the frequency offset.

As discussed above, the actual gain setting with regard to changing the phase in response to an up or down pulsing of CDR control signal 240 is a design choice. Should the gain be too high, the control may become unstable in that the in-phase clock rate may be over-corrected such that it does not converge to the desired rate. On the other hand, a low gain is stable but may take an unacceptably long time to converge to the desired rate. The presence of jitter may thus prevent a low gain embodiment from converging. To provide faster convergence for a given gain setting, a second algorithm may be used as discussed with regard to FIG. 4.

Figure 4:
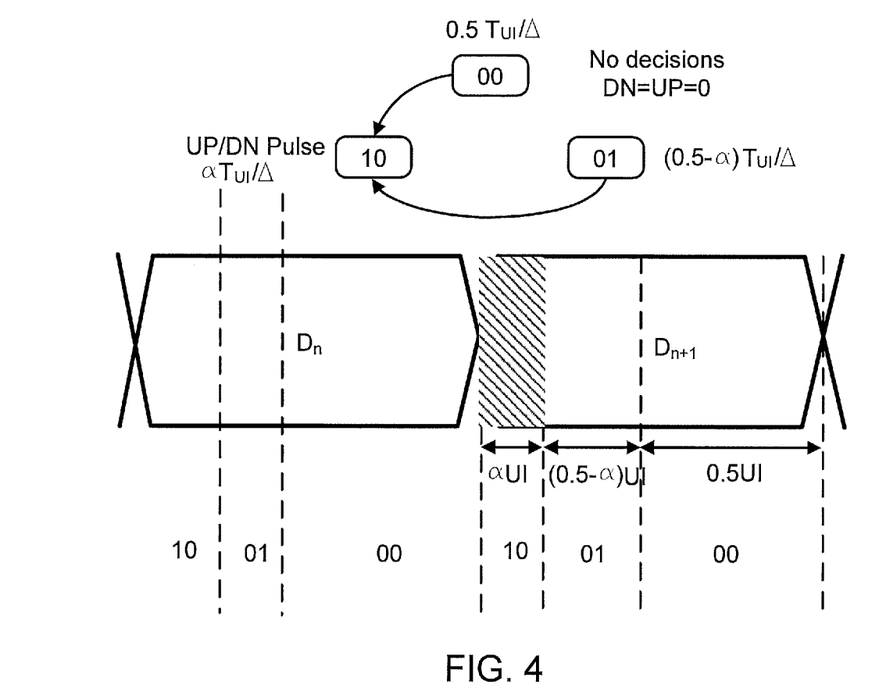
FIG. 4 is a timing diagram for a binary control algorithm for the CDR circuit of FIG. 2.

In the second control algorithm, so long as the in-phase data sample Di is taken in the region 10 (corresponding to the generation of the timing word 10), either an up or down pulse is maintained. In contrast, just one up or down pulse is generated in the linear control algorithm discussed with regard to FIG. 3 when its boundary 300 is crossed. The control of the in-phase clock rate according to the second control algorithm thus does not have the linear relationship to the frequency offset as was the case for the linear control algorithm. The second control algorithm is thus denoted herein as a "binary" control algorithm in that the pulsing control is binary: either the timing word 10 is sampled in which case an up or down pulse is generated or one of the other timing word is generated in which case CDR control signal 240 is left unchanged. The up or down pulsing depends upon from which direction the 10 region is entered. Should the previous timing word be 01, the entry into region 10 indicates that the in-phase clock rate is too fast such that a down pulse is generated. But this down pulse will be repeated in subsequent CDR cycles so long as the timing word remains equal to 10. On the other hand, should the previous timing word have been equal to 00, the entry into region 10 indicates that the in-phase clock rate is too slow such that CDR control signal 240 is pulsed up for the current CDR cycle. This up pulsing of CDR control signal 240 is continued in subsequent CDR cycles so long as the timing word generation continues to equal 10.

All other timing word transitions for the second control algorithm maintain CDR control signal 240 as unchanged. In other word, if the transition is 10 to 01, 10 to 00, 01 to 00, or 00 to 01, CDR control signal 240 is maintained constant for the current CDR cycle. Regardless of what the gain setting is for a given up or down pulse, it may be seen that the binary control algorithm will converge faster as compared to the same gain setting as used in the linear control algorithm. However, this increased convergence comes with the danger of over-controlling the phase change for the in-phase clock such that the desired synchronization of the in-phase clock to the middle of the data eye is not achieved. To obtain the benefits from both alternative control algorithms, embodiments of phase interpolator control circuit 235 may be configured to initially use the binary control algorithm and to then switch to the linear mode. For example, suppose that the in-phase clock edge has drifted into the 10 region during the binary mode and remains there over multiple CDR cycles. The very slow drift of the in-phase clock with respect to the data rate then indicates that in-phase clock rate has gotten close to convergence (synchronized with the data). However, the corresponding up or down pulses would be maintained so long as the in-phase clock edge continues to sample within the 10 region. This is undesirable in that the clock rate has nearly converged yet the phase is continued to be pulsed up or down. Interpolator control circuit 235 may be configured to start in the binary mode and use a threshold with regard to the number of CDR cycles in which the timing word continues to equal 10. Should the number of consecutive CDR cycles in which the timing word continues to equal 10 exceed some positive plural threshold N, interpolator control circuit 235 may then switch to the linear mode. This combination of the binary and linear modes is quite advantageous in that rapid convergence is achieved without the danger of over-controlling the phase shifts of the in-phase clock (and its associated auxiliary and quadrature clocks). Once convergence is achieved, the timing word will drift between 00 and 01. The resulting in-phase clock may then be delivered as the recovered clock along with the data as shown in FIG. 2. As known in the CDR arts, the received data may then be de-serialized according to the recovered clock (the synchronized in-phase clock). A method of operation for an example CDR circuit will now be discussed.

Figure 5:
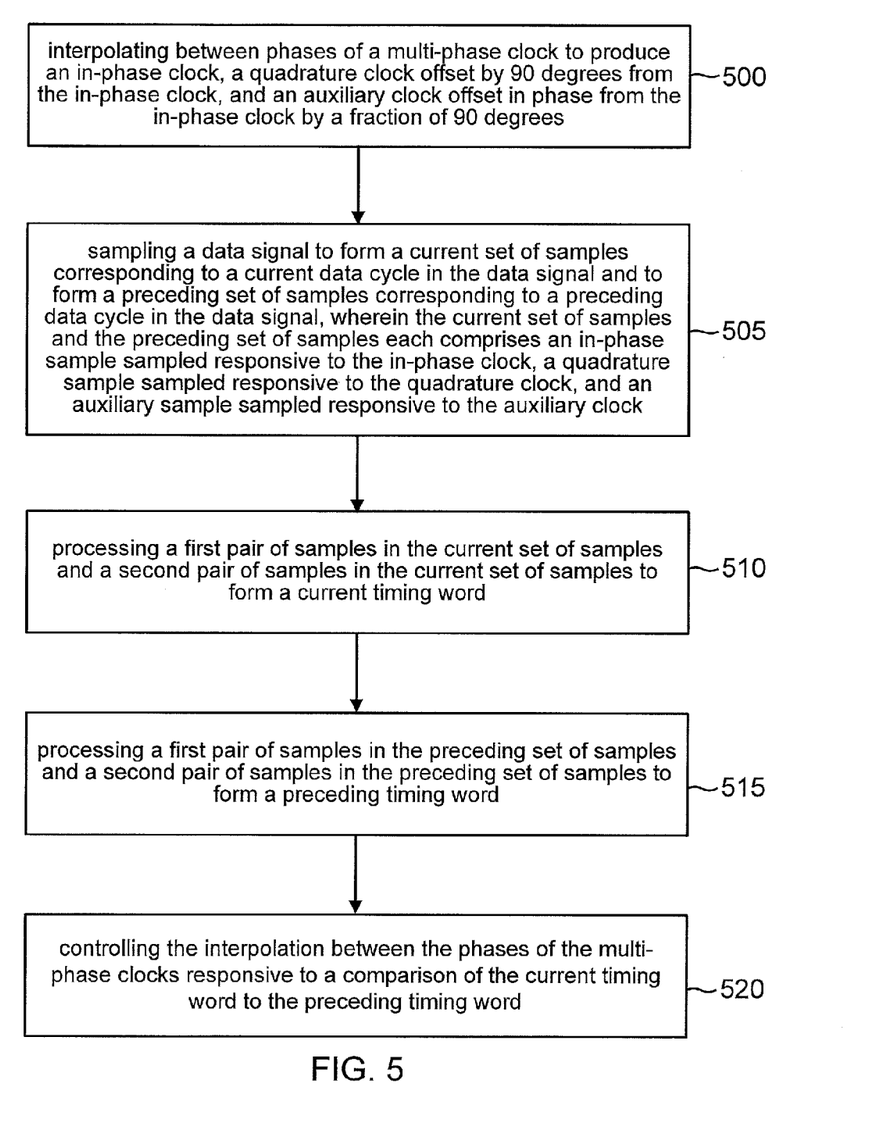
FIG. 5 is a flowchart for an example method of operation for a CDR circuit in accordance with an embodiment of the disclosure.

FIG. 5 is a flowchart for an example method of operation. A first act comprises interpolating between phases of a multi-phase clock to produce an in-phase clock, a quadrature clock offset by 90 degrees from the in-phase clock, and an auxiliary clock offset in phase from the in-phase clock by a fraction of 90 degrees. The production of the corresponding clocks by phase interpolator 210 is an example of act 500. The method further comprises an act 505 of sampling a data signal to form a current set of samples corresponding to a current data cycle in the data signal and to form a preceding set of samples corresponding to a preceding data cycle in the data signal, wherein the current set of samples and the preceding set of samples each comprises an in-phase sample sampled responsive to the in-phase clock, a quadrature sample sampled responsive to the quadrature clock, and an auxiliary sample sampled responsive to the auxiliary clock. The production of any one of sample sets 105, 110, and 115 in FIG. 1 is an example of producing the current set of samples. The same process is carried out for a preceding data cycle such as for data bit Dn of FIG. 1 to produce the preceding set of samples. In general, this preceding set of samples need not be taken from the immediately-preceding data cycle to a current data cycle but may instead be sampled from a more remotely preceding data cycle.

The method further comprises an act 510 comprising processing a first pair of samples in the current set of samples and a second pair of samples in the current set of samples to form a current timing word. Similarly, the method further comprises an act 515 of processing a first pair of samples in the preceding set of samples and a second pair of samples in the preceding set of samples to form a preceding timing word The production of a timing word for each set of samples through XOR gates 225 and 230 of FIG. 2 is an example of acts 510 and 515. Finally, the method includes an act 520 comprising controlling the interpolation between the phases of the multi-phase clocks responsive to a comparison of the current timing word to the preceding timing word. The comparison of timing words such as discussed with regard to the linear and binary control algorithms to adjust CDR control signal 240 so that the in-phase clock is synchronized with the data rate is an example of act 520. Given the resulting synchronization of the in-phase clock, a deserializing of the data signal responsive to the in-phase clock may proceed as is conventional in a CDR circuit.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A clock and data recovery (CDR) circuit comprising:
   a phase interpolator configured to interpolate from various phases of a multi-phase clock to provide an in-phase clock, a quadrature clock offset in phase by a quadrature phase offset from the in-phase clock, and an auxiliary clock offset in phase from the in-phase clock by a fraction of the quadrature phase offset;
   a data sampler configured to sample a data signal to form a set of samples comprising an in-phase sample sampled responsive to the in-phase clock, a quadrature sample sampled responsive to the quadrature clock, and an auxiliary sample sampled responsive to the auxiliary clock; and
   a CDR logic circuit configured to process a first pair of samples from the set of samples and to process a second pair of samples from the set of samples to control the interpolation by the phase interpolator, wherein the second pair of samples is different from the first pair of samples.

2. The CDR circuit of claim 1, wherein the first pair of samples comprises the in-phase sample and the auxiliary sample, and wherein the second pair of samples comprises the auxiliary sample and the quadrature sample.

3. The CDR circuit of claim 1, wherein the CDR logic circuit comprises:
   a first logic gate configured to determine a first bit of a timing word based on the first pair of samples;
   a second logic gate configured to determine a second bit of the timing word based on the second pair of samples; and
   a phase interpolator control circuit configured to control the phase interpolator responsive to the timing word.

4. The CDR circuit of claim 3, wherein the first logic gate comprises a first XOR gate, and wherein the second logic gate comprises a second XOR gate, the timing word comprising a two-bit timing word formed from the first bit and the second bit.

5. The CDR circuit of claim 3, wherein the phase interpolator control circuit is further configured to compare the timing word to a previously-calculated timing word, and wherein the phase interpolator control circuit is further configured to control the phase interpolator responsive to the comparison.

6. The CDR circuit of claim 3, wherein the first logic gate and the second logic gate are configured to generate the timing word such that the timing word equals one of three possible values depending on whether the in-phase data sample is taken in one of three separate regions of a current data cycle for the data signal, and wherein the phase interpolator control circuit is further configured to change the interpolation by the phase interpolator responsive to which of the three possible values that the timing word equals.

7. The CDR circuit of claim 6, wherein the phase interpolator control circuit is further configured to change the interpolation by the phase interpolator responsive to the timing word indicating that an edge for the in-phase clock has transitioned across a beginning of the current data cycle as compared to an in-phase clock sampling of a previous data cycle.

8. The CDR circuit of claim 7, wherein the phase interpolator control circuit is further configured to command the phase interpolator to increase a phase for the in-phase clock responsive to the timing word indicating that the edge for the in-phase clock edge transitioned across the beginning of the current data cycle in a first direction, and to command the phase interpolator to decrease the phase for the in-phase clock responsive to the timing word indicating that the in-phase clock edge transitioned across the beginning of the current data cycle in a second direction opposite to the first direction.

9. The CDR circuit of claim 6, wherein the phase interpolator control circuit is further configured to command the phase interpolator to change a phase for the in-phase clock responsive to the timing word indicating that the in-phase data sample was taken from a particular one of the regions of the current data cycle.

10. The CDR circuit of claim 9, wherein the particular region is a starting region for the current data cycle.

11. The CDR circuit of claim 6, wherein a first one of the regions extends from a beginning of the current data cycle to a fraction α of the current data cycle, where α is greater than 0 and less than 0.5.

12. The CDR circuit of claim 11, wherein a second one of the regions extends from an end of the first region to a midpoint of the current data cycle, and wherein a remaining third one of the regions extends from an end of the second region to an end of the current data cycle.

13. The CDR circuit of claim 1, further comprising:
a multi-phase phase-locked loop configured to provide the multi-phase clock to the phase interpolator.

14. The CDR circuit of claim 13, wherein the various phases of the multi-phase clock comprise a 0 degree clock, a 90 degree clock, an 180 degree clock, and a 270 degree clock.

15. The CDR circuit of claim 1, wherein the CDR logic circuit is further configured to control the interpolation by the phase interpolator to synchronize the in-phase clock to one-half of the data rate for the data signal.

16. A method, comprising:
interpolating between phases of a multi-phase clock to produce an in-phase clock, a quadrature clock offset by 90 degrees from the in-phase clock, and an auxiliary clock offset in phase from the in-phase clock by a fraction of 90 degrees;
sampling a data signal to form a current set of samples corresponding to a current data cycle in the data signal and to form a preceding set of samples corresponding to a preceding data cycle in the data signal, wherein the current set of samples and the preceding set of samples each comprises an in-phase sample sampled responsive to the in-phase clock, a quadrature sample sampled responsive to the quadrature clock, and an auxiliary sample sampled responsive to the auxiliary clock;
processing a first pair of samples in the current set of samples and a second pair of samples in the current set of samples to form a current timing word;
processing a first pair of samples in the preceding set of samples and a second pair of samples in the preceding set of samples to form a preceding timing word; and
controlling the interpolation between the phases of the multi-phase clocks responsive to a comparison of the current timing word to the preceding timing word.

17. The method of claim 16, further comprising deserializing the data signal according to the in-phase clock.

18. The method of claim 16, wherein the auxiliary clock and the quadrature clock are both advanced in phase with regard to the in-phase clock.

19. The method of claim 16, wherein the auxiliary clock and the quadrature clock are both delayed in phase with regard to the in-phase clock.

20. The method of claim 16, wherein processing each first pair of samples comprises XORing the first pair of samples, and wherein processing each second pair of samples comprises XORing the second pair of samples.

21. A clock and data recovery (CDR) circuit comprising:
a phase interpolator configured to interpolate between phases of a multi-phase clock to produce an in-phase clock, a quadrature clock offset by 90 degrees from the in-phase clock, and an auxiliary clock offset in phase from the in-phase clock by a fraction of 90 degrees;
a data sampler configured to sample a data signal to form a current set of samples and a preceding set of samples, wherein the current set of samples and the preceding set of samples each comprises an in-phase sample sampled responsive to the in-phase clock, a quadrature sample sampled responsive to the quadrature clock, and an auxiliary sampled responsive to the auxiliary clock;
a pair of logic gates configured to produce a current timing word for current set of samples and a preceding timing word for the preceding set of samples; and
means for controlling the interpolation by the phase interpolator responsive to a comparison of the current timing word to the preceding timing word.

* * * * *